(12) United States Patent
You

(10) Patent No.: US 7,359,269 B2
(45) Date of Patent: Apr. 15, 2008

(54) SEMICONDUCTOR MEMORY DEVICE FOR REDUCING PEAK CURRENT DURING REFRESH OPERATION

(75) Inventor: Min-Young You, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 450 days.

(21) Appl. No.: 10/749,350

(22) Filed: Dec. 31, 2003

(65) Prior Publication Data

US 2006/0133182 A1   Jun. 22, 2006

(30) Foreign Application Priority Data

Apr. 30, 2003   (KR) .................. 10-2003-0027759

(51) Int. Cl.
*G11C 7/00* (2006.01)
*G11C 8/00* (2006.01)

(52) U.S. Cl. .................. 365/222; 365/230.03; 365/194
(58) Field of Classification Search ................ 365/222, 365/230.03, 194
See application file for complete search history.

(56) References Cited

U.S. PATENT DOCUMENTS

| | | | |
|---|---|---|---|
| 6,058,451 A * | 5/2000 | Bermingham et al. ...... | 365/222 |
| 6,415,353 B1 * | 7/2002 | Leung ........................ | 365/222 |
| 6,570,803 B2 * | 5/2003 | Kyung ....................... | 365/222 |
| 6,587,389 B2 * | 7/2003 | De Paor et al. ............ | 365/222 |
| 6,590,822 B2 * | 7/2003 | Hwang et al. .............. | 365/222 |
| 6,594,189 B2 * | 7/2003 | Shimoyama ................ | 365/222 |
| 6,778,458 B2 * | 8/2004 | Tsern et al. ................ | 365/222 |
| 6,859,407 B1 * | 2/2005 | Suh ............................ | 365/222 |
| 6,930,944 B2 * | 8/2005 | Hush ......................... | 364/222 |
| 6,954,387 B2 * | 10/2005 | Kim et al. .................. | 365/222 |
| 6,954,388 B2 * | 10/2005 | Thomann et al. .......... | 365/222 |
| 6,956,782 B2 * | 10/2005 | Hoehler ..................... | 365/222 |
| 6,973,007 B2 * | 12/2005 | Kim ........................... | 365/222 |
| 7,043,599 B1 * | 5/2006 | Ware et al. ................ | 365/222 |
| 7,164,615 B2 * | 1/2007 | Park et al. ................. | 365/222 |
| 7,184,350 B2 * | 2/2007 | Remaklus et al. ......... | 365/222 |
| 7,187,608 B2 * | 3/2007 | Ha et al. .................... | 365/222 |
| 7,248,532 B2 * | 7/2007 | Schoenfeld ................ | 365/222 |
| 7,263,020 B2 * | 8/2007 | Pyo et al. ................... | 365/222 |

FOREIGN PATENT DOCUMENTS

| KR | 100269618 | 7/2000 |
|---|---|---|
| KR | 1020020047487 | 6/2002 |

* cited by examiner

*Primary Examiner*—Trong Phan
(74) *Attorney, Agent, or Firm*—Blakely Sokoloff Taylor & Zafman

(57) ABSTRACT

A semiconductor memory device comprises a plurality of banks, each having first and second cell mats, each having a plurality of word lines; a data access controller for selecting a word line from the first cell mat and the second cell mat in response to the row address and a refresh signal to be used in a refresh operation; and a bank controller for sequentially enabling the first cell mat and the second cell mat in response to a bank address and the refresh signal.

6 Claims, 4 Drawing Sheets

SEMICONDUCTOR MEMORY DEVICE FOR REDUCING PEAK CURRENT DURING REFRESH OPERATION

FIELD OF INVENTION

The present invention relates to a semiconductor memory device; and, more particularly, to a semiconductor memory device reducing peak current during a refresh operation.

DESCRIPTION OF PRIOR ART

Generally, a semiconductor memory device has two different types, one is a dynamic random access memory (DRAM) and the other is a static random access memory (SRAM).

Since a memory cell included in the SRAM is formed by four latched transistors, the SRAM can hold its data without external refresh, for as long as power is supplied to the SRAM.

In contrast, a memory cell included in the DRAM is formed by a transistor and a capacitor, and the capacitor has to be charged or discharged for the DRAM operation. Charge quantity stored in the capacitor, however, reduces as time passes. Therefore, the DRAM must be refreshed periodically in order to hold its data contents.

Refresh operation for the DRAM is described below.

A word line included in the DRAM is selected sequentially every predetermined period; and, then, charge stored in a capacitor included in a memory cell corresponded to the selected word line is amplified by a sense amplifying unit. The amplified charge is stored into the capacitor again. Therefore data stored in the memory cell can be kept without any loss.

FIG. 1 is a block diagram showing a conventional DRAM.

As shown, the conventional DRAM 100 includes a RAS controller 11, a pre decoder 12, a main decoder 13, a sub decoder 14, a repair circuit unit 15, a word line driver 16, a sense amplifier controller 18, a cell block 20 and a data access controller 30.

The RAS controller 11 receives a bank address BA. The pre decoder 12 is controlled by the RAS controller 11 and decodes a five bit row address signal A<9:13>. The main decoder 13 decodes a mat signal MS<0:31> from the pre decoder 12 and a six bit row address signal A<3:8>.

The sub decoder 14 decodes the mat signal MS<0:31> outputted from the main decoder 13 and a three bit row address signal A<0:2>. The repair circuit unit 15 is controlled by the RAS controller 11 and receives a twelve bit row address signal A<2:13>; and, then, outputs a repaired word line selecting signal RMWL<0:31> for selecting a repaired word line if the twelve bit row address signal A<2:13> is repaired.

The word line driver 16 receives the repaired word line selecting signal RMWL<0:31> outputted from the repair circuit unit 15, a first decoded signal MWL<0:63> outputted from the main decoder 13 and a second decoded signal FXB<0:7> outputted from the sub decoder 14; and, then, generates a word line selecting signal SWL for selecting and driving a word line included in the cell block 20.

The sense amplifier controller 18 is controlled by a RAS control signal RASCTL_OUTPUT generated from the RAS controller 11 to generate a sense amplifier control signal SACTL_OUTPUT. The cell block 20 includes a plurality of memory cells.

The cell block 20 includes a first cell block 21 and a second cell block 22. Each of those two cell blocks 21 and 22 has same number of memory cells.

The data access controller 30 receiving an external row address signal AD<0:13> transfers a fourteen bit signal to the first cell block 21 and the second cell block 22 at a data access operation, or transfers the fourteen bit row address signal A<0:12> to each of the two cell blocks 21 and 22 fixing a highest row address signal A <13> at the refresh operation.

A first sense amplifier unit 19A senses and amplifies data in memory cells coupled to an activated word line included in the first cell block 21. A second sense amplifier unit 19B senses and amplifies data in memory cells coupled to an activated word line included in the second cell block 22. The first sense amplifier unit 21 and the second sense amplifier unit 22 are controlled by the sense amplifier control signal SACTL_OUTPUT.

Referring to FIGS. 1 and 2, the refresh operation of the conventional DRAM is described below.

Generally, the number of word lines included in a memory cell block of a semiconductor memory device depends on the number of bits of a row address signal inputted to the memory cell block. In case of FIG. 1, a 14-bit row address signal is inputted to the cell block 20, and, therefore, there are 16×1024 word lines corresponded to the 14 bit row address signal.

For instance, in case of a 1 giga-byte memory device, 30-bit row address signal is needed for the 1 giga-byte memory device. 2 bit among the 30 bits of the 30-bit row address signal are for selecting a bank, other 14 bits are for a row address selecting word lines and the other 14 bits are for a column address selecting bit lines. Therefore, there are provided 16×1024 word lines corresponded to the 14-bit row address signal and there are also provided 16×1024 memory cells per every word line.

As described above, the DRAM must be refreshed in order to hold its data contents. Hereinafter, the refresh operation of the DRAM according to prior art is described in detail.

If the bank address BA is inputted to the RAS controller 11 and a refresh enable signal REF is activated, a word line of the first cell block 21 is activated and refreshed; and, at the same time, a word line of the second cell block 22 is also activated and refreshed.

Herein, the row address for selecting word lines for the refresh operation is 13 bits because the number of word lines included in the first cell block 21 is a half of the whole number of word lines included in the cell block 20.

As a result, since the first sense amplifier unit 19A and the second sense amplifier unit 19B operate simultaneously during the refresh operation, peak current is increased rapidly.

The increased peak current prevents the conventional DRAM from operating stably.

SUMMARY OF INVENTION

It is, therefore, an object of the present invention to provide a semiconductor memory device for reducing peak current during a refresh operation.

In accordance with an aspect of the present invention, there is provided a semiconductor memory device including a plurality of banks, each having first and second cell mats, each having a plurality of word lines; a data access controller for selecting a word line from the first cell mat and the second cell mat in response to the row address and a refresh signal to be used in a refresh operation; and a bank controller for sequentially enabling the first cell mat and the second cell mat in response to a bank address and the refresh signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
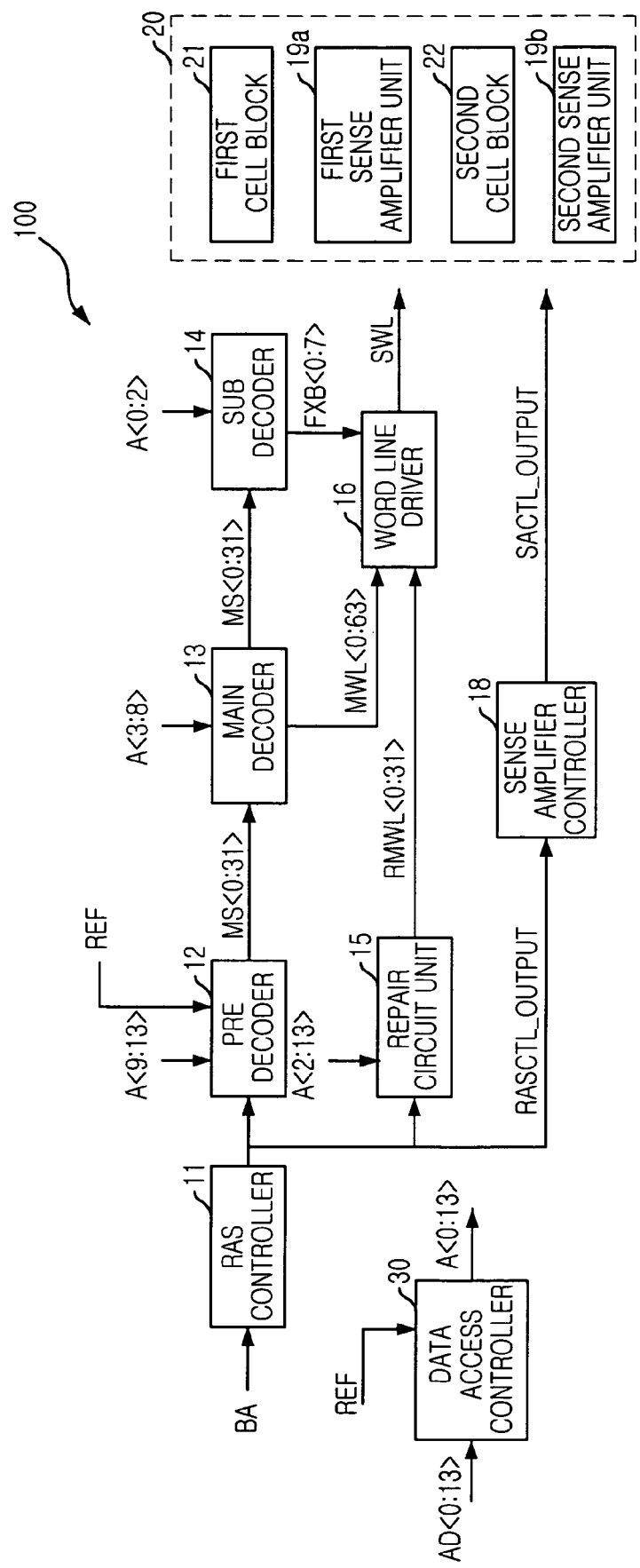
FIG. 1 is a block diagram showing a conventional DRAM.
Figure 2:
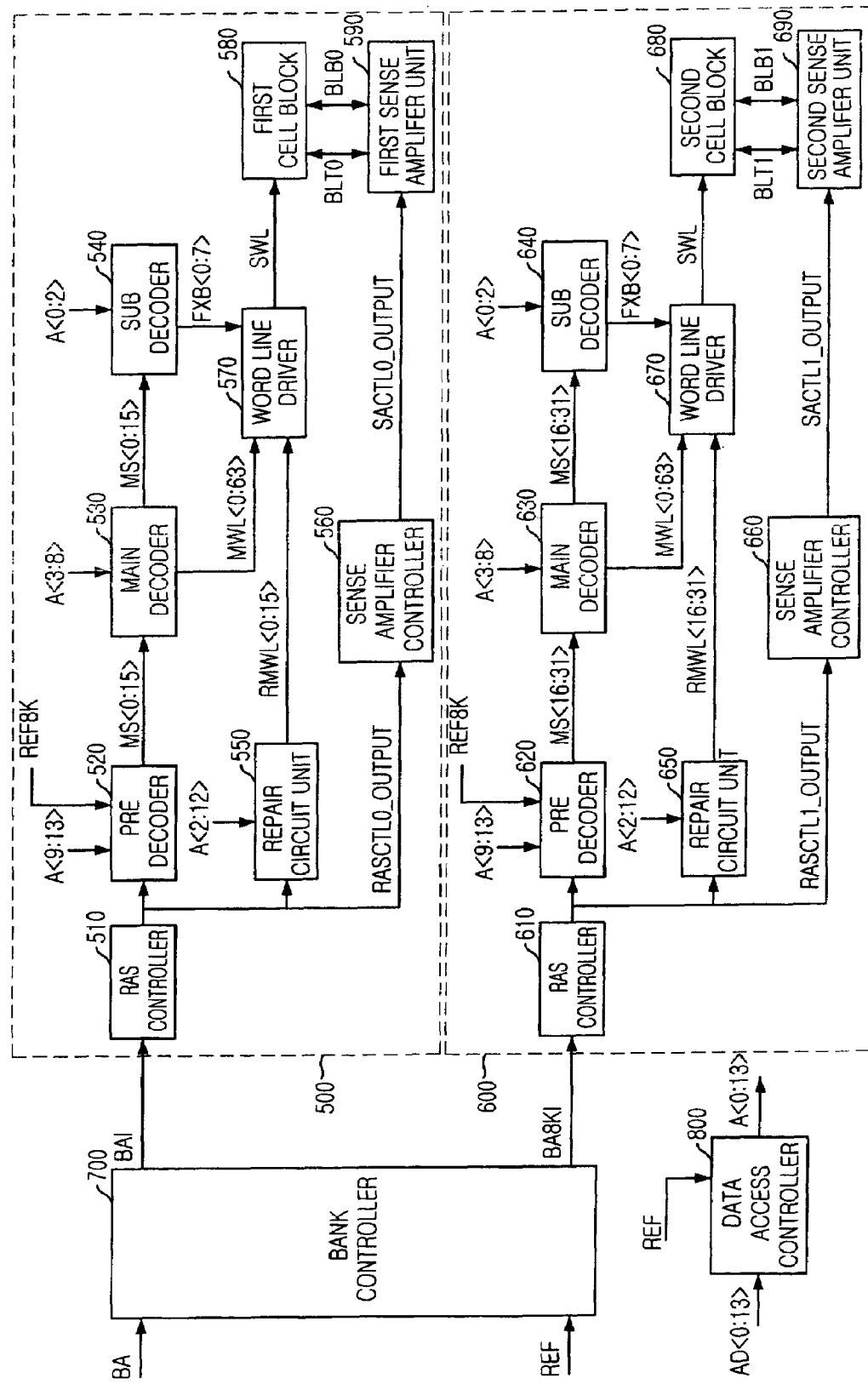
FIG. 2 is a block diagram showing a semiconductor memory device in accordance with the present invention.

FIG. 2 is a block diagram showing a semiconductor memory device in accordance with the present invention.

As shown, the semiconductor memory device includes a first cell mat 500, a second cell mat 600, a data access controller 800 and a bank controller 700.

Each of the first cell mat 500 and the second cell mat 600 includes 8×1024 word lines. The data access controller 800 activates a word line of the first cell mat 500 or the second cell mat 600 at a data access operation; however, at a refresh operation, the data access controller 800 activates a word line of the first cell mat 500 and a word line of the second cell mat 600.

The bank controller 700 enables the first cell mat 500 and the second cell mat 600. At the data access operation, the bank controller 700 enables both of the first cell mat 500 and the second cell mat 600 at the same time; however, at the refresh operation, the bank controller 700 does not enables the cell mat 500 and the cell mat 600 simultaneously.

The first cell mat 500 includes a first RAS controller 510, a first pre decoder 520, a first main decoder 530, a first sub decoder 540, a first repair circuit unit 550, a first word line driver 570, a first sense amplifier controller 560, a first cell block 580 and a first sense amplifier unit 590.

The first RAS controller 510 receives a first cell mat enable signal BAI. The first pre decoder 520 receives a five bit row address signal A<9:13> to decode the received five bit row address signal A<9:13>, where the first pre decoder 520 is controlled by the first RAS controller 510. The first main decoder 530 receives a first mat selection signal MS<0:15> from the first pre decoder 520 and a six bit row address signal A<3:8> to decode the received two signals MS<0:15> and A<3:8>.

The first sub decoder 540 receives the first mat selection signal MS<0:15> from the first main decoder 530 and a three bit row address signal A<0:2> to decode the received two signals MS<0:15> and A<0:2>. The first repair circuit unit 550 receives a eleven bit row address signal A<2:12> and generates a first repaired word line selecting signal RMWL<0:15> for selecting a repaired word line if the received thirteen bit row address signal A<2:12> is repaired, where the first repaired circuit unit 550 is controlled by the first RAS controller 510.

The first word line driver 570 receives a first decoded signal MWL<0:63> outputted from the first main decoder 530, a second decoded signal FXB<0:7> outputted from the first sub decoder 540 and the first repaired word line selecting signal RMWL<0:15> outputted from the first repair circuit unit 550 in order to decode the received three signals MWL<0:63>, FXB<0:7> and RMWL<0:15>.

The first sense amplifier controller 560 is controlled by a first RAS control signal RASCTL0_OUTPUT outputted from the first RAS controller 510 to generate a first sense amplifier control signal SACTL0_OUTPUT. The first cell block 580 includes a plurality of memory cells. The first sense amplifier unit 590 is for amplifying data included in selected memory cells that are transferred through lines BLT0 and BLB0.

The second cell mat 600 includes a second RAS controller 610, a second pre decoder 620, a second main decoder 630, a second sub decoder 640, a second repair circuit unit 650, a second word line driver 670, a second sense amplifier controller 660, a second cell block 680 and a second sense amplifier unit 690.

The second RAS controller 610 receives a second cell mat enable signal BA8KI. The second pre decoder 620 receives the five bit row address signal A<9:13> to decode the received row address signal A<9:13>, where the second pre decoder 620 is controlled by the second RAS controller 610.

The second main decoder 630 receives a second mat selection signal MS<16:31> outputted from the second pre decoder 620 and the six bit row address signal A<3:8> in order to decode the received two signals MS<16:31> and A<3:8>. The second sub decoder 640 receives the second mat selection signal MS<16:31> and the three bit row address signal A<0:2> in order to decode the received two signals MS<16:31> and A<0:2>.

The second repair circuit unit 650 receives the eleven bit row address signal A<2:12> and generates a second repaired word line selecting signal RMWL<16:31> for selecting a repaired word line if the received eleven bit row address signal A<2:12> is repaired, where the second repaired circuit unit 650 is controlled by the second RAS controller 610.

The second word line driver 670 receives a third decoded signal MWL1<0:63> outputted from the second main decoder 630, a fourth decoded signal FXB1<0:7> outputted from the second sub decoder 640 and the second repaired word line selecting signal RMWL<16:31> from the second repair circuit unit 650, then, decodes the received three signals MWL1<0:63>, FXB1<0:7> and RMWL<16:31>.

The second sense amplifier controller 660 is controlled by a second RAS control signal RASCTL1_OUTPUT outputted from the second RAS controller 610 to generate a second sense amplifier control signal SACTL1_OUTPUT. The second cell block 680 includes a plurality of memory cells. The second sense amplifier unit 690 is for amplifying data included in selected memory cells memory cells that are transferred through lines BLT1 and BLB1.

Figure 3:
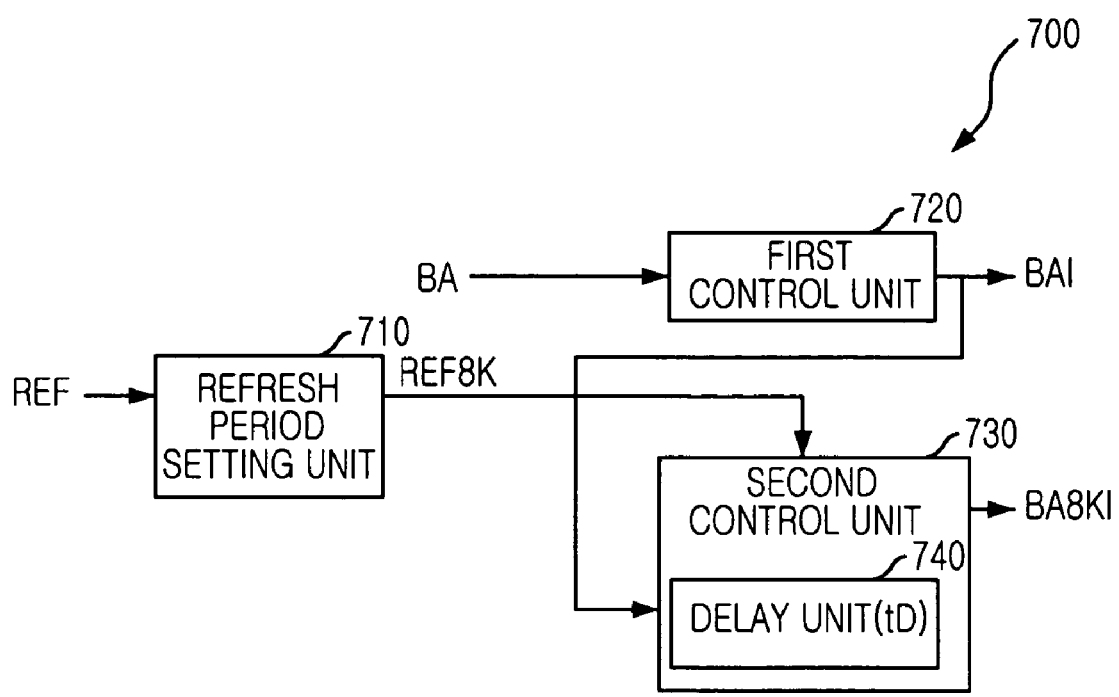
FIG. 3 is a block diagram showing a bank controller shown in FIG. 2.

FIG. 3 is a block diagram showing the bank controller 700 shown in FIG. 2.

As shown, the bank controller 700 includes a first control unit 720, a second control unit 730 and a refresh period setting unit 710.

The first control unit 720 generates the first cell mat enable signal BAI for enabling the first cell mat 500 using a bank address signal BA. The second control unit 730 receives the first cell mat enable signal BAI and outputs the second cell mat enable signal BA8KI without delay at the data access operation; however, at the refresh operation, the second control unit 730 outputs the second cell mat enable signal BA8KI after delaying the first cell mat enable signal BAI for a predetermined time decided by a delay unit (tD) 740.

The refresh period setting unit 710 receives a refresh enable signal REF to generate a refresh period setting signal REF8K for controlling a refresh period of the first cell mat 500 and the second cell mat 600. Herein, the refresh period setting signal REF8K keeps its activated state from the time when the first cell mat enable signal BAI becomes activated to the time when the second cell mat enable signal BA8KI becomes inactivated.

Figure 4:
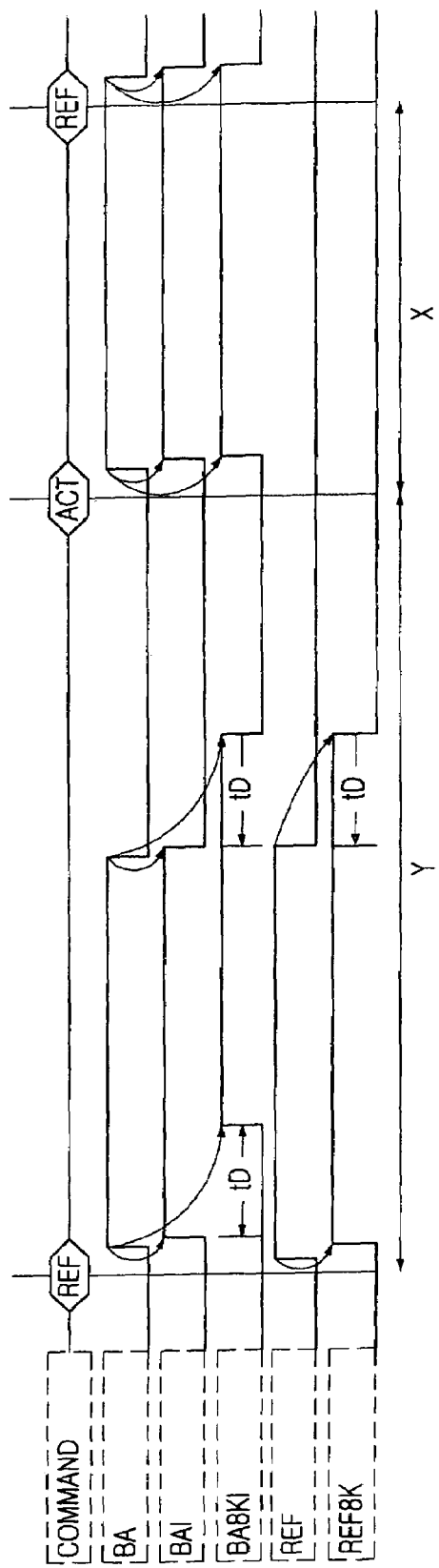
FIG. 4 is a timing diagram showing an operation of the semiconductor memory device in accordance with the present invention.

FIG. 4 is a timing diagram showing an operation of the semiconductor memory device in accordance with the present invention.

Referring to FIGS. 3, 4 and 5, the operation of the semiconductor memory device is described below.

The bank controller 700, at the data access operation for writing or reading data, generates the first cell mat enable signal BAI and the second cell mat enable signal BA8KI at the same timing using the bank address signal BA.

Therefore, the two cell mats 500 and 600 are enabled simultaneously, and the data access controller 800 transfers the fourteen bit row address A<0:13> to the two cell mats 500 and 600.

Therefore, one of word lines included in the first cell block 580 and the second cell block 680 is activated.

Subsequently, the first sense amplifier unit 590 or the second sense amplifier unit 690 operates according to the activated word line; then, one of the two sense amplifier units 590 and 690 amplifies data loaded in memory cells corresponded to the activated word line.

As described above, in case of 1 giga-byte DRAM having four banks, if each bank included in the 1 giga-byte DRAM has 16×1024 word lines, the each bank also has 16×1024 bit lines connected to sense amplifiers. Therefore, if a word line is activated, data stored in 16×1024 memory cells corresponded to the word line is amplified by sense amplifiers.

Thereafter, in case of reading operation, one of the amplified data is selected by a column address and outputted. Then, the amplified data is restored to memory cells. In case of writing operation, the amplified data is substituted by an external data, then, restored to memory cells.

The bank controller 700, at the refresh operation, outputs the first cell mat enable signal BAI to the first cell mat 500, and outputs the second cell mat enable signal BA8KI to the second cell mat 600 after delaying for the predetermined time using the bank address signal BA. Herein, the predetermine time is marked as 'tD' in FIG. 4.

The data access controller 800 transfers the thirteen bit row address A<0:12> to each of the cell mats 500 and 600 fixing the highest row address A<13>.

As described above, at the data access operation for reading or writing data, 14-bit row address signal is needed for selecting a word line from both of the cell mats 500 and 600. However, at the refresh operation, two word lines are selected, one from the first cell mat 500 and the other from the second cell mat 600. Therefore, a 13-bit row address signal is needed to select a word line from each of the cell mats 500 and 600. That's why the data access controller 800 transfers the thirteen bit row address A<0:12> to each of the cell mats 500 and 600.

Since the bank controller 700 outputs the first cell mat signal BAI and the second cell mat enable signal BA8KI at different time, i.e., outputs the first cell mat signal BAI first, then, outputs the second cell mat enable signal BA8KI after the predetermined time tD, the first cell mat 500 and the second cell mat 600 are activated at different time.

Subsequently, a word line of the first cell mat 500 is activated first, and a word line of the second cell mat 600 is activated after the predetermined time tD.

Therefore, the first sense amplifier unit 590 and the second sense amplifier unit 60 operate at different time; and, then, peak current can be reduced.

As described above, if a word line is activated, 16×1024 sense amplifiers have to operate. Therefore, in case of a semiconductor memory device according to prior art, 2×16×1024 sense amplifiers have to operate simultaneously during the refresh operation. However, in case of the semiconductor memory device in accordance with the present invention, 16×1024 sense amplifiers start to operate first and the other 16×1024 sense amplifiers start to operate after the predetermined time at the refresh operation. Therefore, peak current could be reduced in the semiconductor memory device in accordance with the present invention.

Referring to FIG. 4, the bank controller 700 outputs the first cell mat enable signal BAI and the second cell mat enable signal BA8KI at the same time during data access operation (this operation period is marked as 'X'); however, the bank controller 700 outputs the first cellm at enable signal BAI first, then, outputs the second cell mat enable signal BA8KI after the predetermined time tD at the refresh operation (this operation period is marked as 'Y'). Each operation period is determined by commands REF and ACT.

As shown, the refresh period setting unit 710 included in the bank controller 700 outputs the refresh period setting signal REF8K to the first cell mat 500 and the second cell mat 600. Herein, the refresh period setting signal REF8K keeps its activated state from the time when the first cell mat enable signal BAI becomes activated to the time when the second cell mat enable signal BA8KI becomes inactivated.

Comparing the refresh period setting signal REF8K with the refresh enable signal REF, a logic 'HIGH' period of REF8K is longer than that of the REF by the predetermined time tD because the cell mats 500 and 600 operate at different time at the refresh operation.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   first and second cell mats, each having a plurality of word lines;
   a data access controller for selecting a word line from the first cell mat and the second cell mat in response to a row address and a refresh signal to be used in a refresh operation; and
   a bank controller for controlling enablement of the first cell mat and the second cell mat respectively to prevent the first cell mat and the second cell mat from enabling simultaneously during the refresh operation,
   wherein the bank controller includes a first control unit for generating a first cell mat enable signal in response to a bank address, a refresh period setting unit for generating a refresh period setting signal in response to the refresh signal, and a second control unit for receiving the first cell mat enable signal and the refresh period setting signal to generate a second cell mat enable signal.

2. The semiconductor memory device as recited in claim 1, wherein the bank controller enables the first cell mat firstly, then, after a predetermined time, enables the second cell mat at the refresh operation.

3. The semiconductor memory device as recited in claim 2, wherein the first cell mat is enabled in response to the first cell mat enable signal.

4. The semiconductor memory device as recited in claim 3, wherein the second cell mat is enabled in response to the second cell mat enable signal.

5. The semiconductor memory device as recited in claim 1, wherein the second control unit outputs the first cell mat enable signal as the second cell mat enable signal at a data access operation or outputs the first cell mat enable signal as the second cell mat enable signal after delaying the first enable signal for a predetermined time at the refresh operation.

6. The semiconductor memory device as recited in claim 5, wherein the second control unit includes a delay unit for delaying the first cell mat enable signal.

* * * * *